United States Patent  (10) Patent No.: US 8,334,716 B1
Davidson et al.  (45) Date of Patent: Dec. 18, 2012

(54) DIGITAL PHASE DETECTION CIRCUIT AND METHOD

(75) Inventors: Allan Thomas Davidson, San Jose, CA (US); Marwan A. Khalaf, San Carlos, CA (US); Daniel Bowersox, Somerset, PA (US); Michael Menghui Zheng, Fremont, CA (US); Neville Carvalho, Campbell, CA (US)

(73) Assignee: Altera Corporation, San Jose, CA (US)

(*) Notice: Subject to any disclaimer, the term of this patent is extended or adjusted under 35 U.S.C. 154(b) by 541 days.

(21) Appl. No.: 12/580,175

(22) Filed: Oct. 15, 2009

Related U.S. Application Data (60) Provisional application No. 61/139,419, filed on Dec. 19, 2008.

(51) Int. Cl.
*H03K 3/00* (2006.01)
(52) U.S. Cl. ............ 327/236; 327/234; 327/243; 327/3; 327/8
(58) Field of Classification Search .................. None
See application file for complete search history.

(56) References Cited

U.S. PATENT DOCUMENTS 5,223,755 A * 6/1993 Richley ......................... 327/158
6,944,257 B2 * 9/2005 Riley .............................. 377/47

* cited by examiner

*Primary Examiner* — An Luu
(74) *Attorney, Agent, or Firm* — Womble Carlyle Sandridge & Rice, LLP (57) ABSTRACT

A digital phase detector circuit and corresponding monitor and control logic is presented. The digital phase detector has two storage elements, where the data input of the first storage element receives a first clock signal and the data input of the second storage element receives a second clock signal. A time shifter shifts the second clock signal by a shift period, and transmits the shifted signal to the clock input of the storage elements. The signals applied to the data inputs are transmitted from the storage elements when the clock input receives the shifted second clock signal from the time shifter. A monitor and control module samples the data output from the storage elements after each shifted second clock signal is transmitted by the time shifter. The sampling of the output data provides the data used to determine the time relationship between the first and the second clock signals.

19 Claims, 5 Drawing Sheets

DIGITAL PHASE DETECTION CIRCUIT AND METHOD

CLAIM OF PRIORITY

This application claims priority from U.S. Provisional Patent Application No. 61/139,419, filed Dec. 19, 2008, and entitled "Digital Phase Detection Circuit and Method." This provisional application is herein incorporated by reference.

BACKGROUND

In many electronic systems there is a need to know the phase difference (or time difference) between two high-speed clock signals of nominally equal frequency within the system. These signals are generally clock signals, but can also be data signals. This need applies to signals within a single device, or signals on a circuit board between multiple devices.

It is very common in a circuit design for registers to be driven using different clock inputs. Moreover, it is commonplace that an integrated circuit or an electronic system operates using multiple clock signals, where the clock signals are operating at nominally equal frequencies. Knowledge about the phase or time relationship between the clock signals is useful information for the user. Current schemes for determining this relationship require counters that operate at frequencies much higher than the signals being measured. These counters start when one signal occurs, and stop when another signal occurs, the count then being representative of the time difference between the two signals. Such schemes are limited to lower frequency applications due to the difficulty in designing counters that can operate much faster than the high frequency signals being measured. In addition, the current methodology may be intrusive, such that the device is not able to operate while the determination of the timing or phase relationship is made.

It is in this context that embodiments of the invention arise.

SUMMARY

Embodiments of the present invention provide circuits and methods for determining a phase or time difference between clock signals of nominally equal frequency. It should be appreciated that the present invention can be implemented in numerous ways, such as a process, an apparatus, a system, a device or a method on a computer readable medium. Several inventive embodiments of the present invention are described below.

In one embodiment, a digital phase detector circuit and corresponding monitor and control logic are provided. The digital phase detector has two storage elements, where the data input of the first storage element receives a first clock signal and the data input of the second storage element receives a second clock signal. A time shifter shifts the second clock signal by a shift period, and transmits the shifted signal to the clock input of the storage elements. The clock signals applied to the data inputs are transmitted from the data output of the storage elements when the clock input receives the shifted second clock signal from the time shifter. A monitor and control module samples the data output from the storage elements after each shifted second clock signal is transmitted by the time shifter. The sampling of the output data provides the data used to determine the time relationship or phase relationship between the first and the second clock signals.

In another embodiment, a method for determining a phase difference between clock signals of nominally equal frequency is provided. The method transmits the first signal to the data input of the first storage element and the second signal to the data input of the second storage element. A shifted version of the second signal is generated, such that the second signal is shifted by an amount of time equal to a shift period. The shifted signal is then transmitted to the clock input of both the storage elements. Output data from the storage elements is stored and used to determine the time difference between the first and the second signals.

Other aspects of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

The embodiments described below enable non-intrusive measurement of the phase difference, or time difference, between clock signals of nominally equal frequency in an electronic system. Clock signals of nominally equal frequency, as defined herein, are clock signals that have approximately the same frequency. It should be appreciated that counters running at frequencies higher than the signals being measured are not needed in the embodiments described below. In addition, the embodiments described below do not require any signals to run faster than the signals being measured, and the time or phase difference between the clock signals is determined solely through the signals themselves.

The embodiments described herein provide for the non-intrusive measurement of the phase or timing difference for two clock signals of nominally equal frequency within the system or device. As mentioned above, the clock signals may be two clock signals within a single device, or clock signals running on a circuit board between multiple devices in one embodiment. It should be appreciated that the digital phase detector circuitry described herein may be distributed throughout an integrated circuit, such as a microprocessor, programmable logic device (PLD), such as an application-specific integrated circuit (ASIC), field programmable gate array (FPGA), etc. Through the embodiments described herein, the two clock signals of nominally equal frequency are provided to the data input of two storage elements, such as a data (D) flip-flop. One of the two clock signals is also provided as the clock signal to the clock input of each of the storage elements. The clock signal provided to the clock input of each storage element is time shifted in order to capture data indicating the relative position of the two clock signals so that further processing, such as aligning the clock signals, etc., may be performed.

Figure 1:
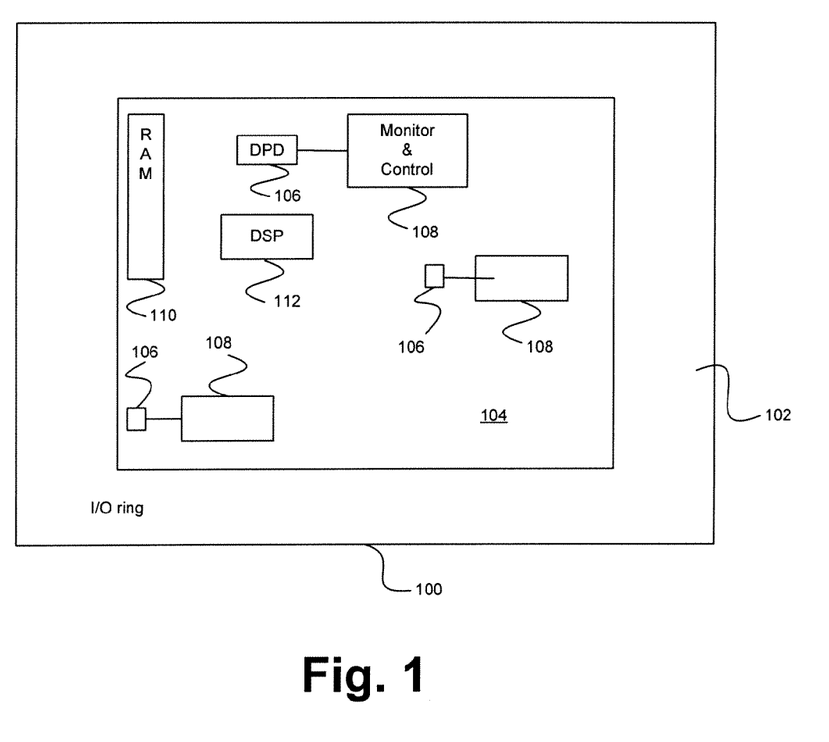
FIG. 1 is a simplified schematic diagram illustrating a high level overview for an integrated circuit containing the digital phase detector in accordance with one embodiment of the invention.

FIG. 1 is a simplified schematic diagram illustrating a high level overview for an integrated circuit containing the digital phase detector in accordance with one embodiment of the invention. Integrated circuit 100 is provided with a core region 104 and an input/output ring 102. In one embodiment, the integrated circuit is a PLD, such as a FPGA, or ASIC. In another embodiment, the integrated circuit 100 is a processor. The core region 104 includes a plurality of digital phase detector circuits 106 in communication with monitor and control module 108. It should be appreciated that any configuration of the digital phase detector circuits 106 and monitor and control modules 108 may be provided. That is, the digital phase detector circuits 106 and monitor and control modules 108 may be grouped in one area or distributed throughout integrated circuit 100. In addition to the digital phase detector circuits 106 and monitor and control module 108, core region 104 includes random access memory (RAM) 110 and additional logic, such as digital signal processing (DSP) 112. It should be appreciated that RAM 110 may be provided throughout the core region 104 and further logic besides digital signal processing 112 may be provided within core region 104, as FIG. 1 is exemplary and not meant to be limiting.

Figure 2:
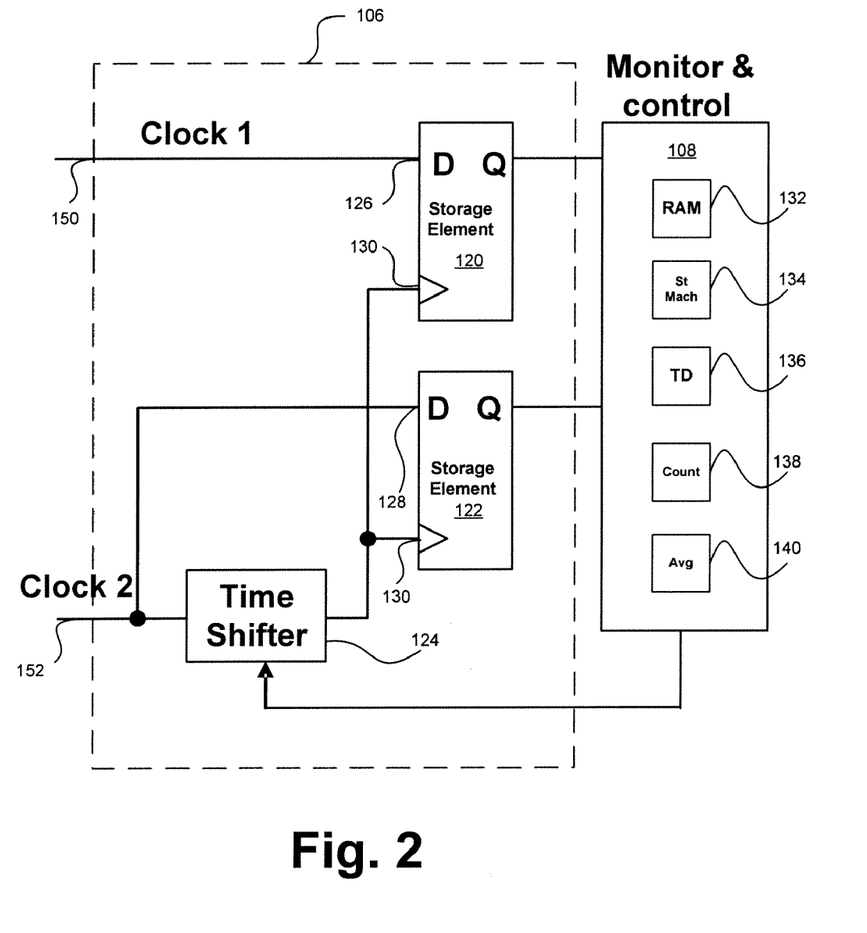
FIG. 2 is a simplified schematic diagram illustrating further details of the circuitry for the digital phase detector in accordance with one embodiment of the invention.

FIG. 2 is a simplified schematic diagram illustrating further details of the circuitry for the digital phase detector in accordance with one embodiment of the invention. The digital phase detector 106 receives a first and second clock signal 150 and 152. Clock signals 150 and 152 are clock signals of nominally equal frequency in one embodiment. That is, the first clock (Clock 1) signal 150 operates at a frequency that is nominally equal to the second clock (Clock 2) signal 152. Within the digital phase detector 106 are two storage elements 120 and 122. In one embodiment, the storage elements 120 and 122 are D flip-flops. As illustrated in FIG. 2, the first clock signal 150 is transmitted to the data input 126 of storage element 120 and the second clock signal 152 is transmitted to the data input 128 of storage element 122. The second clock signal 152 is also transmitted to time shifter 124 and then distributed to the clock input 130 of storage elements 120 and 122. In another embodiment, clock signals 150 and 152 from multiple areas throughout the integrated circuit are routed to the digital phase detector 106, where the clock signals to be measured can be selected using a multiplexer.

It should be appreciated that any suitable time shifter may be used in module 124. In one embodiment, a phased-lock loop (PLL) with programmable phase shift may be used as the time shifter 124. In another embodiment, a programmable delay line may be used as the time shifter 124. The time shifter 124 functions to provide the clock signal to the clock input 130 of both of the storage elements 120 and 122. When the storage elements 120 and 122 receive the clock signal at the clock input 130, the signal at the data input 126 and 128 is transmitted from the output 131 of the storage elements 120 and 122. The output data of each storage element 120 and 122 is sampled through the monitor and control module 108. In addition, the monitor and control module 108 is capable of storing the output data states of each sampling into either local memory 132 or external memory. The amount of time delay imparted on the clock signal by the time shifter 124 is determined by the monitor and control module 108. In another embodiment, time shifter 124 sweeps through a range of time delays which are applied to the clock signal as directed by monitor and control module 108.

According to one embodiment of the present invention, the monitor and control module 108 further includes a local memory 132 used to store the output data states, and a state machine 134 that controls the time shifter 124. It should be appreciated that the state machine 134 can be constructed using electronic logic that is configured to store the previous state of the state machine 134, and then use the previous state to calculate the next state. In one state, the state machine 134 samples the output 131 of each storage element 120 and 122. In other states, the state machine 134 writes the output data state of each storage element 120 and 122 to the local memory 132. Then the state machine 134 transmits a control signal to the time shifter 124, triggering a time shift of the second clock signal by a shift period.

In another embodiment, the monitor and control block 108 further includes a transition detection circuit 136 and a shift counter circuit 138. Rather than storing the output data state of each storage element 120 and 122 in local memory 132, the transition detection circuit 136 analyzes the output data states of the storage elements 120 and 122 to determine if a transition in the output data state of the first storage element 120 or the second storage element 122 has occurred. Once a transition in the output data state of either storage element 120 and 122 is detected, the transition detection circuit 136 activates the shift counter circuit 138. The shift counter circuit 138 counts the number of time shifts that take place until the transition detection circuit 136 detects another transition in the output data state of either the first storage element 120 or the second storage element 122. In yet another embodiment, the output 131 of each storage element 120 and 122 can be sampled multiple times and stored in memory 132. The monitor and control module 108 may further include an averaging circuit 140 that averages the multiple samples of the output data state stored in the local memory 132. The averaging circuit 140 computes the average value of the stored multiple samples and converts the samples into a logical representation, as described below.

Figure 3:
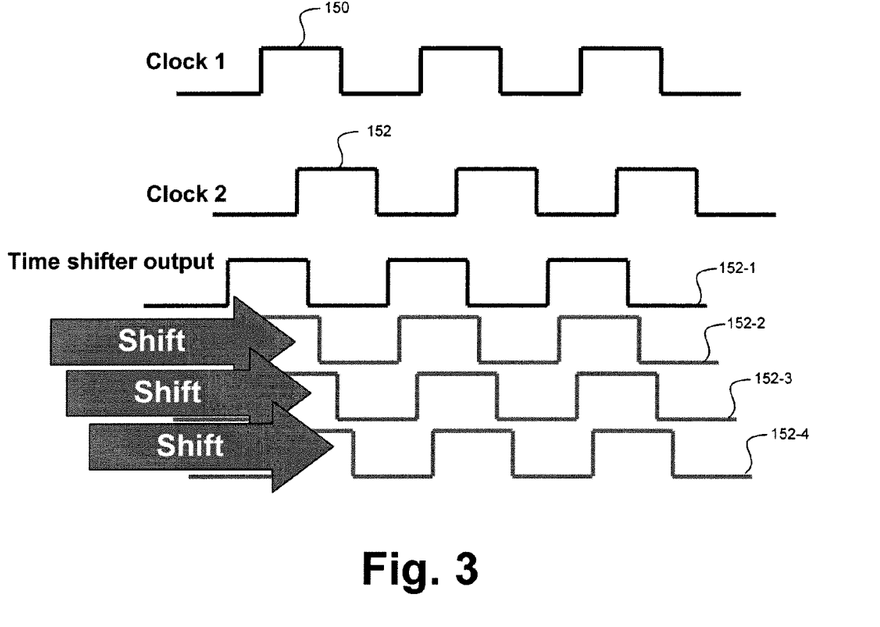
FIG. 3 is a simplified schematic diagram illustrating the waveforms for the two different clock signals and the shifted clock signal from the time shifter in accordance with one embodiment of the invention.

FIG. 3 is a simplified schematic diagram illustrating the waveforms for the two different clock signals and the shifted clock signal from the time shifter in accordance with one embodiment of the invention. Waveform 150 illustrates the waveform for the first clock (Clock 1) signal and waveform 152 illustrates the waveform for the second clock (Clock 2) signal. As illustrated, waveform 150 and waveform 152 are not aligned, but have nominally equal period or frequency. The time shifter of FIG. 2 is utilized to shift the waveform of the second clock signal 152 that is used to clock both of the storage elements, as illustrated in waveforms 152-1 through 152-4 in FIG. 3. One skilled in the art will appreciate that the amount of the time shift for each consecutive waveform 152-1 to 152-4 may be selectable by a user. In one exemplary embodiment, not meant to be limiting, a 50 picosecond shift for each consecutive shifted clock waveform 152-1 through 152-4 is made. As the time shifter sweeps through the various shifts for a cycle associated with the clock signals of nominally equal frequency for waveforms 150 and 152, using any suitable shift period or resolution, the output data state of each of the storage elements is sampled and may be stored for future analysis.

Figure 4:
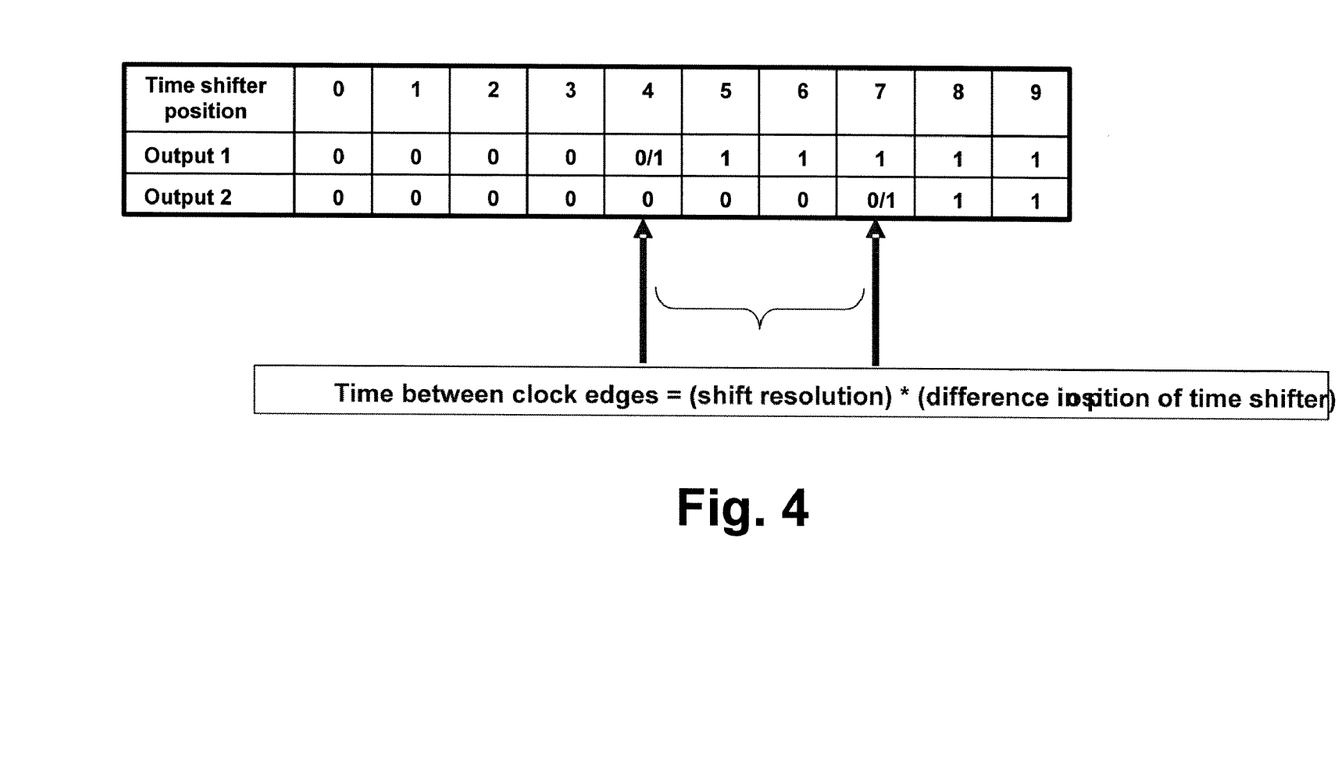
FIG. 4 illustrates an exemplary format for storing the output data state for each storage element in memory in accordance with one embodiment of the invention.

FIG. 4 illustrates an exemplary format for storing the output data state for each storage element in memory in accordance with one embodiment of the invention. On the top row of FIG. 4, the different time shifter positions 0 through 9 are illustrated. Each time position may correspond to a certain fixed time period, which may be referred to as a shift period and each shift period corresponds to an amount of delay introduced to the clock signal by the time shifter of FIG. 2. The output data state from each storage element is sampled after each position of the time shifter. In row two, the output data state of the first storage element (Output 1) at each time position is sampled and stored. In row three, the output data state of the second storage element (Output 2) at each time position is sampled and stored.

In one embodiment, the output data state of each storage element is sampled multiple times at each time period and stored in memory, as described above. The values of the multiple samples are averaged using the averaging circuit of the monitor and control module of FIG. 2, and converted to a logical representation. The logical representation of the output data state corresponds to a logical "0" or logical "1" as illustrated in FIG. 4. The transition point of the output data occurs when the signal at the data input of either storage element is in transition (e.g. the input signal is changing from high to low) at approximately the same time the clock signal is received by the storage elements. At the transition point, the output data state may be averaged to a logical "0" or it may be averaged to a logical "1". It should be appreciated that whether the transition point (noted as 0/1 in the table of FIG. 4 for clarity) is averaged and recorded as logical "0", or is averaged and recorded as logical "1", is not important because it is the relative difference in the transition point between the storage elements that provides the information necessary to determine the time or phase difference. In addition, the table associates the number of time steps imparted by the time shifter with the corresponding logical representation of the output data state of each storage element. The logical representation scheme illustrated in FIG. 4 is exemplary and not meant to be limiting.

As illustrated at time position 4 of row two, a transition is taking place for the data storage element receiving the first clock as the data input. Similarly, in row three the data storage element receiving the second clock illustrates a transition point (e.g. from low to high) at time position 7. Thus, the time between clock edges will be equal to the shift period multiplied by the relative difference in position between the transition point of the first storage element and the transition point of the second storage element. In one exemplary embodiment, not meant to be limiting, if each time shifter position or shift period is 50 picoseconds, and there is a difference of three time shifter positions or shift periods between when the output of the first storage element and the output of the second storage element transitions, then the time difference between clock edges is measured to be 150 picoseconds.

One skilled in the art will appreciate that the knowledge of the time difference between the two signals can be used to optimize setup and hold times of signals, can be used to minimize latency in clock-domain crossing first in/first out's (FIFOs), can be used to measure relative flight times of signals in a system, and can be used for system calibration, both one-time and continuously. Also, one skilled in the art will appreciate knowledge of the time difference enables one to predict set up and hold time problems when transferring data from one clock domain to the other, as well as determine the latency from transferring data from one clock domain to the other.

Figure 5:
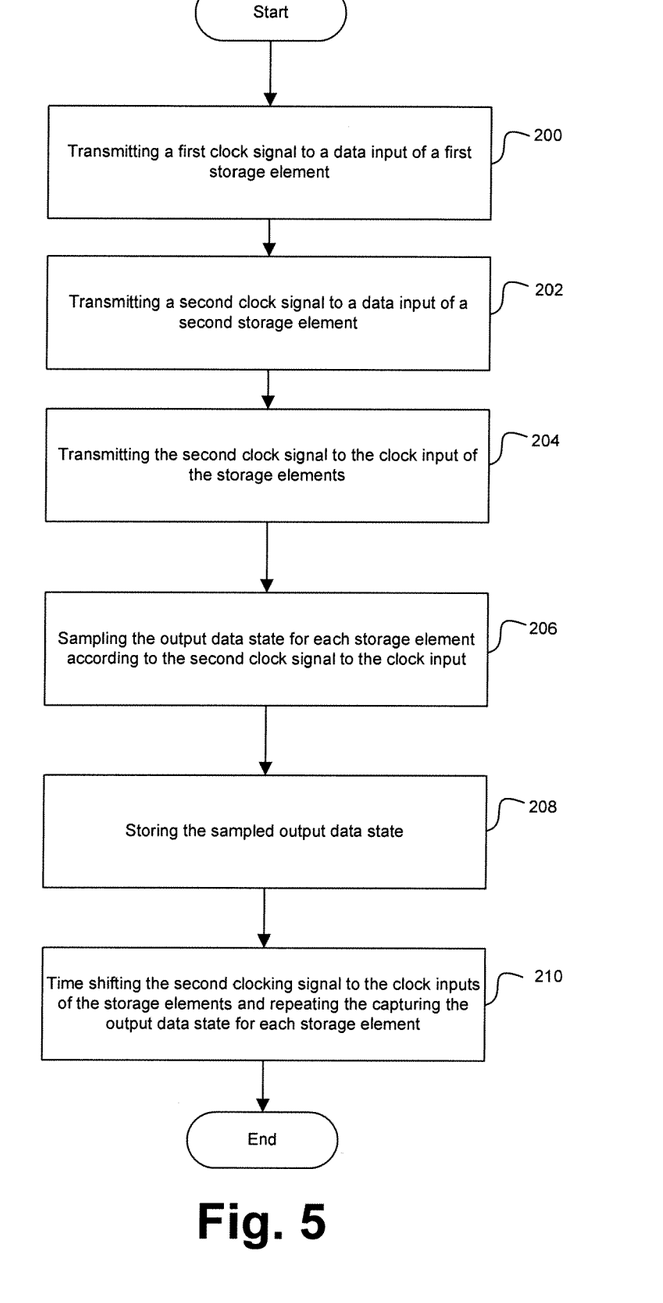
FIG. 5 is a simplified schematic diagram illustrating a method for determining a time difference between signals of nominally equal frequency in accordance with one embodiment of the invention.

FIG. 5 is a simplified schematic diagram illustrating a method for determining one of a time difference between signals of nominally equal frequency in accordance with one embodiment of the invention. The method initiates with operation 200 where a first clock signal is transmitted to a data input of a first storage element concurrent with the inputting of the first clock signal. A second clock signal is transmitted to a data input of a second storage element in operation 202. The method then advances to operation 204 where the clock input of each storage element receives the second clock signal, which clocks through the signal at the data input of each storage element.

In operation 206 the output data state for each storage element is recorded and stored for each time shifter position. As illustrated in FIG. 4, a table capturing this data may be stored in memory. This table may later be evaluated in order to determine the time between clock edges as discussed above with reference to FIG. 4. In one embodiment, the number of time shifter positions where the output data state of the first storage element and the second storage element differ is counted and used to determine the phase difference. Operation 208 specifies that the sampled output state is stored as a logical representation in memory, as illustrated in FIG. 4. In operation 210, the second clocking signal to the clock input of each storage element is shifted and the output sampling of operation 206 is repeated as described above. As illustrated in FIGS. 3 and 4, the second clock signal is shifted as directed by the monitor and control module in order to capture the data at different time positions of the time shifter to determine where the transitions occur for each clock signal.

One skilled in the art will appreciate that either a time shifter, such as a programmable delay line, or a phase shifter, such as a programmable PLL, may be used to shift the second clock signal. It should also be appreciated that while two clock signals are illustrated in the embodiments, this is not meant to be limiting. That is, the embodiments may be extended to determining phase or timing differences between more than two clock signals.

It should be further appreciated the above described embodiments are generally applicable and may be incorporated into any technology. In a specific example, the above described embodiments may be incorporated into the Common Public Radio Interface (CPRI) protocol. CPRI is an initiative to define a publicly available specification that standardizes the protocol interface between the radio equipment control (REC) and the radio equipment (RE) in wireless basestations. In CPRI applications, data is transferred between a wireless basestation and a radio head. These applications require the phase difference between the clock embedded in the CPRI data stream, and the internal device clock, to be determined to a high degree of precision.

As the CPRI protocol continues to evolve, it is possible to implement the link layer in a PLD, such as a FPGA. For example, a number of FPGAs and ASICs of the assignee with embedded transceivers offer a high degree of programmability along with predictable latency. This architecture can incorporate the embodiments described herein in order to determine phase and timing alignments for frequency locked signals. In one embodiment, the wireless basestation in a CPRI system may store the phase difference measured using the above described embodiments as a calibration coefficient. In another embodiment, the CPRI system may perform phase detection periodically as a background process while the CPRI system is running.

Embodiments of the present invention may be practiced with various computer system configurations including handheld devices, microprocessor systems, microprocessor-based or programmable consumer electronics, minicomputers, mainframe computers and the like. The invention can also be practiced in distributed computing environments where tasks are performed by remote processing devices that are linked through a wire-based or wireless network.

The resulting circuit design, described herein may be employed with any integrated circuit, such as processors, programmable logic devices and factory programmed devices. Exemplary PLDs include but are not limited to a programmable array logic (PAL), programmable logic array (PLA), field programmable logic array (FPLA), electrically programmable logic devices (EPLD), electrically erasable programmable logic device (EEPLD), and field programmable gate array. Factory programmed devices include but are not limited to application specific standard product (ASSP), application specific integrated circuit, and standard cell array, just to name a few. Programmable and factory programmed devices can have internal logic, assuming the functions of the bit event logic, and integrated SerDes resulting in more-compact and lower-cost solutions.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purpose, such as a special purpose computer. When defined as a special purpose computer, the computer can also perform other processing, program execution or routines that are not part of the special purpose, while still being capable of operating for the special purpose. Alternatively, the operations may be processed by a general purpose computer selectively activated or configured by one or more computer programs stored in the computer memory, cache, or obtained over a network. When data is obtained over a network the data maybe processed by other computers on the network, e.g., a cloud of computing resources.

The embodiments of the present invention can also be defined as a machine that transforms data from one state to another state. The transformed data can be saved to storage and then manipulated by a processor. The processor thus transforms the data from one thing to another. Still further, the methods can be processed by one or more machines or processors that can be connected over a network. Each machine can transform data from one state or thing to another, and can also process data, save data to storage, transmit data over a network, display the result, or communicate the result to another machine.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, DVDs, Flash, magnetic tapes, and other optical and non-optical data storage devices. The computer readable medium can also be distributed over a network coupled computer systems so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the operations are performed in the desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended exemplary claims.

What is claimed is:

1. A digital phase detector, comprising:
   a first storage element receiving a first clock signal into a data input of the first storage element;
   a second storage element receiving a second clock signal into a data input of the second storage element; and
   a time shifter receiving the second clock signal, the time shifter shifting the second clock signal by a shift period, and the shifted second clock signal is transmitted to a clock input of both the first and the second storage elements, wherein the time shifter is a phase locked loop.

2. The digital phase detector of claim 1, further comprising:
   a monitor and control module for sampling a state of the data output for the first and the second storage elements according to the second clock signal, wherein the sampling occurs for each shifted second clock signal thereby providing data for determining a phase relationship between the first and the second clock signals.

3. The monitor and control module of claim 2, further comprising:
   a memory for storing the state of the data output from the first and the second storage elements for each shifted second clock signal; and
   a state machine for controlling the time shifter.

4. The digital phase detector of claim 2, wherein the monitor and control module detects a transition of the stored data output of the first or the second storage element.

5. The digital phase detector of claim 1, wherein the first and the second storage element is a data flip-flop.

6. The digital phase detector of claim 1, wherein the digital phase detector is a module incorporated in an integrated circuit.

7. An integrated circuit with digital phase detection, comprising:
   a digital phase detector including:
   a first storage element receiving a first clock signal into a first input of the first storage element;
   a second storage element receiving a second clock signal into a first input of the second storage element; and
   a monitor and control module including:
   a state machine sampling data output states for the first and the second storage elements according to the second clock signal, the state machine adjusting the second clock signal transmitted to a second input of respective the first and the second storage element.

8. The integrated circuit of claim 7, further comprising:
   a delay circuit receiving the second clock signal and transmitting a time shifted version of the second clock signal to the second input of the first and the second storage elements.

9. The integrated circuit of claim 7, the monitor and control module further comprises:
   a transition detection circuit analyzing the states of the output from the first and the second storage element to determine a relative difference when a transition occurs in either the first storage element output or the second storage element output.

10. The integrated circuit of claim 9, the monitor and control module circuit further comprises:
a shift counter circuit counting a number of time shift positions until the transition detection circuit detects another transition in the states of the output, wherein the shift counter circuit is activated by the transition detection circuit after detecting the transition of the output data state.

11. The integrated circuit of claim 7, wherein a phase difference of the first clock signal and the second clock signal is defined by a relative difference between a transition position of the first storage element and the second storage element, and a shift period.

12. The integrated circuit of claim 8, wherein the monitor and control module transmits a control signal to the delay circuit, thereby adjusting the second clock signal by a shift period.

13. A method of determining a phase difference between clock signals of nominally equal frequency, comprising:
transmitting a first clock signal to a data input of a first storage element;
transmitting a second clock signal to a data input of a second storage element;
transmitting a shifted version of the second clock signal to a clock input of both the first and the second storage element;
sampling output data of the first and the second storage elements; and
storing a logical state used to determine the phase difference between the first and the second clock signals, wherein the logical state represents the sampled output data.

14. The method of claim 13, further comprising:
generating the shifted version of the second clock signal, such that the second clock signal is shifted by an amount of time equal to a shift period.

15. The method of claim 13, further comprising
associating the stored logical state with a corresponding time shifter position; and
analyzing the stored logical state at each time shifter position to determine a transition point of the output data associated with the first and the second storage element.

16. The method of claim 13, further comprising:
determining a relative difference between a transition point of the first storage element output and a transition position of the second storage element output.

17. The method of claim 16, wherein the time difference between the first and the second clock signals is defined by a relative difference between the transition position of the first storage element and the second storage element and a shift period.

18. The method of claim 13, further comprising:
sampling output data of the first and the second storage elements multiple times after each time shift; and
averaging the multiple samples of the output data state to determine a logical representation of the output data state after each time shift.

19. The method of claim 13, further comprising:
shifting the second clock signal by a shift period after sampling the output of the first and second storage element.

* * * * *